(12) United States Patent  (10) Patent No.: US 8,785,215 B2
Kobayashi et al.  (45) Date of Patent: Jul. 22, 2014

(54) METHOD FOR REPAIRING DAMAGE OF DIELECTRIC FILM BY CYCLIC PROCESSES

(71) Applicant: ASM IP Holding B.V., Almere (NL)

(72) Inventors: Akiko Kobayashi, Tokyo (JP); Yosuke Kimura, Leuven (BE); Dai Ishikawa, Ome (JP); Kiyohiro Matsushita, Fuchu (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 13/901,341

(22) Filed: May 23, 2013

(65) Prior Publication Data

US 2013/0337583 A1   Dec. 19, 2013

Related U.S. Application Data

(60) Provisional application No. 61/653,969, filed on May 31, 2012.

(51) Int. Cl.
 *H01L 21/00* (2006.01)
 *H01L 21/768* (2006.01)

(52) U.S. Cl.
 CPC ............................. *H01L 21/76825* (2013.01)
 USPC ............................................. 438/4; 438/780

(58) Field of Classification Search
 CPC .................................................. H01L 21/76825
 USPC ............................................. 438/4, 780–781
 See application file for complete search history.

(56) References Cited

U.S. PATENT DOCUMENTS

| | | | |
|---|---|---|---|
| 5,504,042 A * | 4/1996 | Cho et al. | 438/781 |
| 5,877,095 A * | 3/1999 | Tamura et al. | 438/791 |
| 6,140,252 A * | 10/2000 | Cho et al. | 438/781 |
| 6,558,755 B2 * | 5/2003 | Berry et al. | 427/489 |
| 6,576,300 B1 * | 6/2003 | Berry et al. | 427/489 |
| 7,842,518 B2 | 11/2010 | Miyajima | |
| 7,851,232 B2 | 12/2010 | van Schravendijk | |
| 2010/0055442 A1 | 3/2010 | Kellock | |
| 2011/0159202 A1 | 6/2011 | Matsushita | |

* cited by examiner

*Primary Examiner* — Richard Booth
(74) *Attorney, Agent, or Firm* — Snell & Wilmer L.L.P.

(57) ABSTRACT

A method for repairing process-related damage of a dielectric film includes: (i) adsorbing a first gas containing silicon on a surface of the damaged dielectric film without depositing a film in the absence of reactive species, (ii) adsorbing a second gas containing silicon on a surface of the dielectric film, followed by applying reactive species to the surface of the dielectric film, to form a monolayer film thereon, and (iii) repeating step (ii). The duration of exposing the surface to the first gas in step (i) is longer than the duration of exposing the surface to the second gas in step (ii).

26 Claims, 5 Drawing Sheets

METHOD FOR REPAIRING DAMAGE OF DIELECTRIC FILM BY CYCLIC PROCESSES

CROSS-REFERENCE TO RELATED APPLICATIONS

This application claims the benefit of U.S. Provisional Application No. 61/653,969, filed May 31, 2012 under 35 USC 119(e), the disclosure of which is herein incorporated by reference in its entirety.

BACKGROUND

1. Field of the Invention

The present invention generally relates to a method for repairing process-related damage of a dielectric film by cyclic processes.

2. Description of the Related Art

Dielectric films are indispensable to increasing processing speed of semiconductor devices and lowering power consumption of the devices. Dielectric films are susceptible to damage during their manufacturing processes, thereby increasing dielectric constants and/or leakage currents. Such process-related damage includes damage caused by dry etching and plasma ashing, and washing with chemicals, and physical damage by chemical mechanical planarization (CMP), etc. Particularly, in advanced devices, dielectric films are porous and have low dielectric constant values. Such porous low-k films are highly susceptible to damage during an etching process for patterning or the like, and when the films are damaged, the dielectric constant values increase. In order to recover the dielectric constant values, restoration of the damaged porous surface is necessary. Further, before depositing a barrier metal or the like, pores of the porous surface must be sealed for inhibiting diffusion of the barrier metal. Thus, after the patterning of the dielectric film but before deposition of a barrier metal thereon, restoration and pore-sealing are necessary.

In order to repair such process-related damage of the dielectric films, U.S. Pat. No. 7,851,232 and U.S. Patent Application Publication No. 2011/0159202, for example, disclose repairing damage by UV-excited reaction using a gas containing carbon. However, although damaged surfaces can be restored to a certain degree by the above methods using a hydrocarbon film, restoration is insufficient depending on the degree of damage. Further, a hydrocarbon film can seal pores of the damaged surfaces, but the hydrocarbon film does not have sufficient barrier function as a pore-sealing film against a barrier metal although it can inhibit diffusion of chemicals such as toluene to a certain degree.

Any discussion of problems and solutions involved in the related art has been included in this disclosure solely for the purposes of providing a context for the present invention, and should not be taken as an admission that any or all of the discussion were known at the time the invention was made.

SUMMARY

Some embodiments of the present invention provide a method for repairing process-related damage of a dielectric film formed on a substrate caused by processing the dielectric film, wherein the dielectric film has a first dielectric constant before the processing, and the damaged dielectric film has a second dielectric constant which is higher than the first dielectric constant, comprising:

(i) adsorbing a first gas containing silicon on a surface of the damaged dielectric film by exposing the surface to the first gas to restore the surface with the first gas without depositing a film in the absence of reactive species, wherein the surface-restored dielectric film has a third dielectric constant which is lower than the second dielectric constant;

(ii) adsorbing a second gas containing silicon on a surface of the surface-restored dielectric film by exposing the surface to the second gas, followed by applying reactive species to the second gas-adsorbed surface of the dielectric film, to form a monolayer film thereon, wherein the duration of exposing the surface to the first gas in step (i) is longer than the duration of exposing the surface to the second gas in step (ii); and (iii) repeating step (ii) to accumulate monolayer films to cover the surface of the surface-restored dielectric film.

In some embodiments, step (i) corresponds to a restoration step of a porous surface damaged during processes, wherein the first gas is adsorbed on the porous surface. Typically, the damage occurs inside the porous dielectric film, and the first gas (which may be referred to as a "restoration gas") is required to be diffused and adsorbed through pores having a size on the nanometer order. Since the porous surface has a large surface area and has a low conductance, it takes more time for the gas to reach all the surfaces and be saturated thereon than in the case where the gas is adsorbed on a flat surface. Since this process is a self-limiting adsorption reaction process, the number of deposited gas molecules is determined by the number of reactive surface sites (i.e., damaged surfaces having OH groups) and is independent of the gas exposure after saturation, and a supply of the gas is such that the reactive surface sites are saturated thereby, and a self-assembling monolayer is formed. In some embodiments, the duration of exposure of the damaged surface to the first gas (the duration of gas supply) can be determined by the degree of damage (e.g., an increase of dielectric constant by 0.1, 0.2, 0.3, 0.4 as compared with the dielectric constant of the dielectric film prior to the damage), porosity of the film (e.g., in a range of about 10% to about 60%), flow rate of the first gas (e.g., in a range of about 0.5 sccm to about 20 sccm), etc., based on routine experimentations. Typically, the duration of exposure of the damaged surface to the first gas may be about 2 seconds to about 120 seconds (e.g., including about 3, 5, 10, 20, 40, 80, and values between any two numbers of the foregoing, typically about 5 seconds or longer).

In some embodiments, steps (ii) and (iii) correspond to a pore-sealing step of the surface-restored dielectric film, wherein pores on the surface are sealed with a pore-sealing film formed using the second gas (which may also be referred to as a "pore-sealing gas"). In some embodiments, the pore-sealing film is constituted by a SiCN material and is capable of completely inhibiting chemical diffusion and significantly improving a barrier function (e.g., resistance to $O_2$ plasma), and is formed by plasma-enhanced atomic layer deposition (PEALD) at a relatively low temperature (e.g., about 150° C. to about 400° C.), thereby forming a film having good characteristics. Since RF power is not exerted directly on the second gas, but is exerted on a reactant, no oxygen radicals nor ammonia radicals are generated from the second gas, thereby sealing pores by a pore-sealing film without significantly causing further damage by radicals to the surface of the dielectric film. In some embodiments, the pulse of the second gas per cycle is about 0.1 seconds to about 10 seconds (preferably about 0.3 seconds to about 3 seconds), which is shorter than the duration of the first gas supply. Since the pore-sealing film is intended to be deposited mainly on a top surface, the pulse of the second gas can be shorter than the duration of the first gas supply. In some embodiments, some pores may be closed by the pore-sealing film while leaving voids in other pores. In some embodiments, the number of cycles for depositing a pore-sealing film is 10 to 1,000, typically 20 to 400.

In some embodiments, although in steps (ii) and (iii), the pore-sealing film is deposited by atomic layer deposition, the surface of the dielectric film is exposed to radicals until the pores are sealed and thus is subject to damage by radicals. Thus, in some embodiments, during the pore-sealing step (steps (ii) and (iii)), step (i) is conducted, i.e., steps (i) to (iii) are repeated continuously. In other words, step (i) is inserted in step (iii) once or more times, depending on the degree of damage caused during step (iii). The duration of inserted step (i) can be shorter than that of first step (i) since the damage caused before the repairing step is greater than the damage caused during step (iii).

In some embodiments, in step (iii), step (ii) is repeated, wherein the conditions of step (ii) can be changed each time when step (ii) is conducted. In this disclosure, "repeating a step" may refer to conducting the step again with or without changing operation variables.

In some embodiments, the substrate has a recess having faces exposing the surface of the damaged dielectric film and a surface of a copper layer, and any of the disclosed methods further comprises treating the surface of the damaged dielectric film and the surface of the copper layer (with, e.g., hydrogen) to selectively reduce the surface of the copper layer relative to the surface of the damaged dielectric film, prior to step (i). In some embodiments, any of the disclosed methods further comprises oxidizing the surface of the damaged dielectric film to further damage the surface of the damaged dielectric film prior to step (i). In some embodiments, any of the disclosed methods further comprises subjecting a surface of the accumulated monolayer films to hydrophobic treatment after step (iii).

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

DETAILED DESCRIPTION

Figure 1:
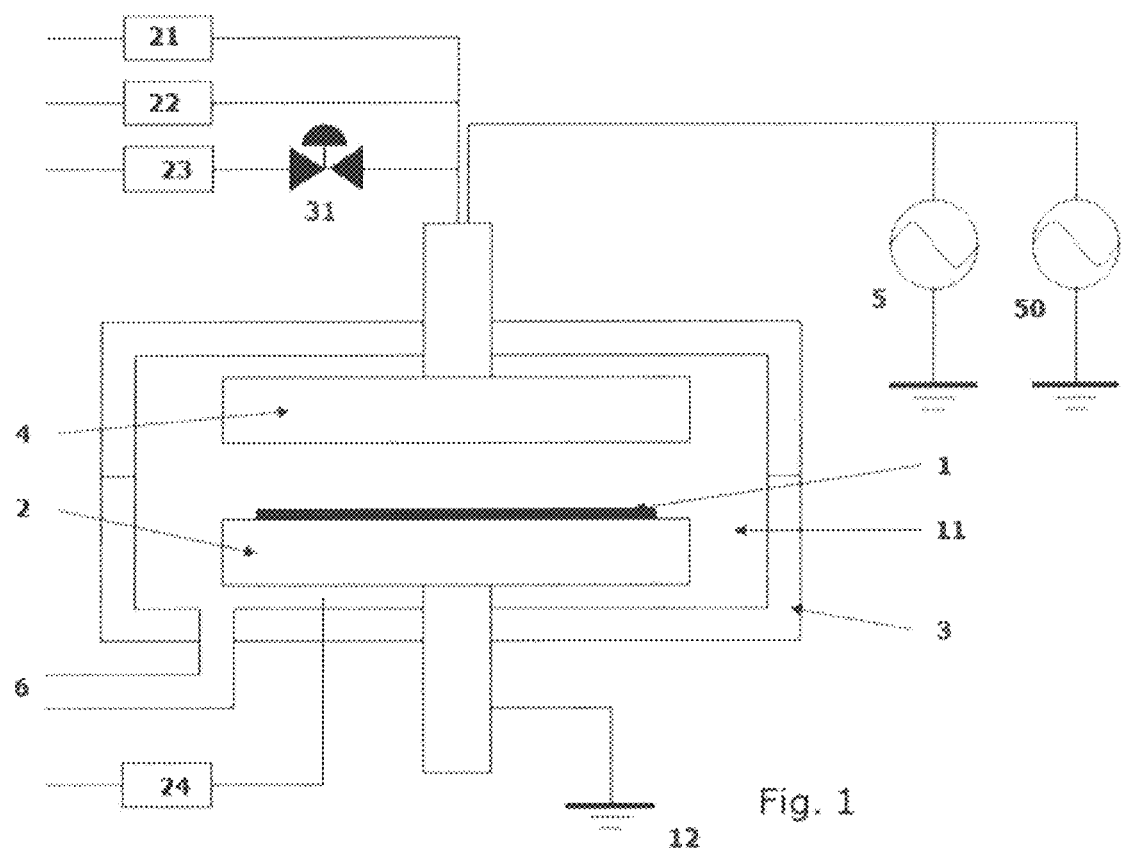
FIG. 1 is a schematic representation of a PEALD apparatus for depositing a dielectric film usable in an embodiment of the present invention.

In this disclosure, "gas" may include vaporized solid and/or liquid and may be constituted by a single gas or a mixture of gases. In this disclosure, "film" may refer to a fixed layer (fixed by using, e.g., active species) which continuously extends in a direction perpendicular to a thickness direction and can grow or can accumulate in the thickness direction beyond a thickness of one atomic layer, "layer" may refer to a structure having a certain thickness formed on a surface, and "monolayer" may refer to a layer having a thickness of substantially or nearly one atomic layer. In some embodiments, a "monolayer" may be formed by a step of adsorption of a precursor on a surface in one cycle of atomic layer deposition (ALD), and the monolayer may not be a film but may be converted or fixed to a monolayer film by a step of surface reaction with reactive species created by, e.g., a plasma or heat. For example, a "monolayer" is a self-assembled layer of molecules having a molecular size of about 1 nm, which molecules are adsorbed in pores with a pore size of 1 to 3 nm of a damaged low-k film and aligned along with OH group terminals present in the pores. A film may be constituted by a discrete single film having certain characteristics or multiple films, and a boundary between adjacent films may or may not be clear and may be established based on physical, chemical, and/or any other characteristics, formation processes or sequence, and/or functions or purposes of the adjacent films. In this disclosure, an article "a" or "an" refers to a species or a genus including multiple species. Further, in this disclosure, any two numbers of a variable can constitute an workable range of the variable as the workable range can be determined based on routine work, and any ranges indicated may include or exclude the endpoints. Additionally, any values of variables indicated may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

In this disclosure, any defined meanings do not necessarily exclude ordinary and customary meanings in some embodiments.

In some embodiments, a method for repairing process-related damage of a dielectric film formed on a substrate caused by processing the dielectric film is provided, wherein the dielectric film has a first dielectric constant before the processing, and the damaged dielectric film has a second dielectric constant which is higher than the first dielectric constant. The process-related damage of a dielectric film may be any damage caused by processing the dielectric film, such as plasma ashing, plasma etching, wet and dry cleaning, etc., resulting in a substantial increase of dielectric constant of a dielectric film such as SiO, SiCO, SiN, SiCN, or other silicon-based multi-element materials. The "substantial increase" refers to at least 10%, 20%, or 30%, in some embodiments. Typically, the damaged surface of the dielectric film develops numerous pores, and is terminated by OH groups. The dielectric film includes, but is not limited to, low-k films constituted by SiC, or boron-based multi-element materials such as borozine, or multi-element hydrocarbon materials, etc., having a dielectric constant of about 1.9 to 5.0, typically about 2.1 to 3.0, preferably less than 2.5. In some embodiments, the dielectric film is formed in trenches or holes including side walls and bottom surfaces, and/or flat surfaces, by plasma-enhanced CVD, thermal CVD, cyclic CVD, plasma-enhanced ALD, thermal ALD, radical-enhanced ALD, or any other thin film deposition methods. Typically, the thickness of the dielectric film is in a range of about 50 nm to about 500 nm (a desired film thickness can be selected as deemed appropriate according to the application and purpose of film, etc.).

In some embodiments, the dielectric film is a porous low-k film or extreme low-k film (ELK film) having properties shown in Table 1 below.

TABLE 1

|  | Porous low-k film properties |
| --- | --- |
| Dielectric Constant (k) | ≤2.3 |
| Refractive Index (at 633 nm) | ≤1.40 |
| Porosity (%) | ≥30% |
| Pore Diameter (nm) | ≤1 nm |
| Elastic Modulus (GPa) | ≤6.5 GPa |

When the dielectric film receives damage by ashing or etching, a restoration step (step (i)) is conducted as a first repair step. In some embodiments, the first repair step is the step of adsorbing a first gas containing silicon on a surface of the damaged dielectric film by exposing the surface to the first gas to restore the surface with the first gas without depositing a film in the absence of reactive species created, wherein the surface-restored dielectric film has a third dielectric constant which is lower than the second dielectric constant. In this disclosure, "reactive species" may refer to species including ions and/or radicals created by a plasma, heat or other energy, which causes surface reaction to form a film.

The surface-restored dielectric film has a third dielectric constant which is lower (e.g., substantially lower, e.g., by at least about 5%, 10%, or 15%) than the second dielectric constant of the dielectric film. In some embodiments, step (i) continues to provide a dielectric constant recovery rate, R, of the surface-restored dielectric film of at least 40% (including 50%, 60%, 70%, and values between any two numbers of the foregoing), wherein R=(∈2−∈3)/(∈2−∈1)×100 where ∈1 is the first dielectric constant, ∈2 is the second dielectric constant, and ∈3 is the third dielectric constant. In some embodiments, R may be about 20% or higher (or about 30% or higher) when the degree of damage is not significant. Typically, the duration of exposure of the damaged surface to the first gas may be about 2 seconds to about 120 seconds (e.g., including about 3, 5, 10, 20, 40, 80, and values between any two numbers of the foregoing, typically about 5 seconds or longer). The dielectric constant of the dielectric film refers to a dielectric constant of a layer having a thickness of, e.g., about 200 nm (or equivalents thereto) as a standard. However, it is confirmed that dielectric constants of layers having a thickness of about 100 nm to about 500 nm are not substantially different from that of a layer having a thickness of about 200 nm.

In some embodiments, the restoration step is performed to restore a surface of the dielectric film by replacing OH groups using the first gas (restoration gas). In some embodiments, "restoring" may refer to restoring resistance to hygroscopicity degraded by damage. In some embodiments, the first gas is a gas capable of replacing OH groups and self-assembling on the surface of the damaged dielectric film, thereby forming a self-assembled monolayer. In some embodiments, the first gas has no Si—C bonds in its molecule. Alternatively, the first gas has at least one Si—C bond in its molecule. In some embodiments, the first gas has one or two Si—N bonds in its molecule. In some embodiments, the first gas contains Si—O bonds in its molecule, and a monolayer constituted by the first gas may refer to a SiO monolayer. Further, in some embodiments, the first gas is a gas constituted by at least one compound selected from the group consisting of aminosilane compounds, alkoxysilane compounds, and silazane compounds. In some embodiments, the restoration gas is constituted by at least one compound selected from the group consisting of bisdiethylaminosilane (BDEAS), bisdimethylaminosilane (BDMAS), hexylethylaminosilane (HEAD), tetraethylaminosilane (TEAS), tert-butylaminosilane (TBAS), bistert-butylaminosilena (BTBAS), bisdimethylaminodimethylaminosilane (BDMADMS), heptametyhlsilazane (HMDS), trimethylsilyldiethlamine (TMSDEA), trimethylsilyldimethlamine (TMSDMA), trimethyltoribinylcycletrisilazane (TMTVCTS), tristrimethylhydroxyanmine (TTMSHA), bisdimethylsaminomethylsilane (BDMAMS), and dimetyhlsilyldimethlamine (DMSDMA). In some embodiments, in step (i), only the first gas is used, or only the first gas and any inactive gas as a carrier gas, dilution gas or purge gas are used, wherein no hydrocarbon gas is used. Alternatively, a hydrocarbon gas or other gas may be added to the first gas. In some embodiments, the atmosphere of step (i) is oxygen-free.

In some embodiments, step (i) comprises supplying the first gas to a reaction space where the substrate is placed and purging the reaction space to remove non-adsorbed first gas from the surface of the dielectric film. The purging can be accomplished by continuously supplying an inactive gas at a constant flow rate throughout step (i), and after the pulse of the first gas supply, the reaction space is purged with the inactive gas. Alternatively, the purging can be accomplished by supplying an inactive gas immediately after the pulse of the first gas supply, or the purging can be accomplished simply by vacuuming the reactor. Alternatively, no purge is conducted, and the pulse of the first gas supply is merged into the pulse of the second gas supply in the next step, wherein the first and second gas is identical and continuously supplied.

In some embodiments, the hydrocarbon restoration step comprises: placing a substrate with a damaged dielectric film formed thereon in a reactor; supplying a first gas in a pulse to the reactor while supplying an inactive gas, thereby allowing the first gas to diffuse and adsorb on surfaces of a porous layer of the dielectric film to restore the damaged dielectric film;

and purging the reactor to remove non-adsorbed first gas from the surfaces by continuously supplying the inactive gas.

In some embodiments, in the restoration step, the conditions for the first gas adsorption shown in Table 2 are used. Since this is a self-limiting adsorption reaction process, the number of deposited gas molecules is determined by the number of reactive surface sites and is independent of the gas exposure after saturation, and a supply of the gas is such that the reactive surface sites are saturated thereby. The supply of the first gas is determinable by the pressure which is set depending on the vapor pressure of the gas.

TABLE 2

(the numbers are approximate)

| | Restoration process conditions |
|---|---|
| First gas pulse (sec): Supply time of first gas | 2 to 120 sec (preferably 5 to 60 sec) |
| Substrate temperature (° C.) | 25. to 400.° C. (preferably 200 to 300.° C.) |
| Pressure (Torr) | 0.5 to 50 Torr (preferably 1 to 10 Torr) |
| Carrier gas | He, Ar |
| Flow rate of carrier gas (sccm) | 500 to 10,000 sccm (preferably 500 to 2,000 sccm) |
| Purge gas | $N_2$, He, Ar |
| Flow rate of purge gas (sccm) | 500 to 10,000 sccm (preferably 500 to 2,000 sccm) |
| Purge upon the first gas pulse | 0 to 10 sec (preferably 0 to 5 sec) |

In some embodiments, the second repair step is constituted by steps (ii) and (iii). Step (ii) comprises adsorbing a second gas containing silicon on a surface of the surface-restored dielectric film by exposing the surface to the second gas, followed by applying reactive species (e.g., created by a plasma such as a nitrogen plasma) to the second gas-adsorbed surface of the dielectric film, to form a monolayer film thereon, wherein the duration of exposing the surface to the first gas in step (i) is longer than the duration of exposing the surface to the second gas in step (ii). Step (iii) comprises repeating step (ii) to accumulate monolayer films to cover the surface of the surface-restored dielectric film, thereby sealing pores of the surface-restored dielectric film. The pore-sealed dielectric film has a fourth dielectric constant which is higher (e.g., by at least about 2%, 3%, 5%, or 10%) than the third dielectric constant of the surface-restored dielectric film. However, the fourth dielectric constant is still significantly lower (e.g., by at least about 5%, 7%, or 10%) than the second dielectric constant of the damaged dielectric film. This step may be referred to as a "pore-sealing step". By this step, the porous surface obtains resistance to diffusion of a barrier metal or the like which is deposited thereon. It can be confirmed by checking resistance to an oxygen plasma of the pore-sealed dielectric film, which is indicative of the resistance to diffusion of a barrier metal. Typically, the pore-sealing step is constituted by PEALD. Alternatively, the pore-sealing step can be accomplished by other cyclic deposition such as thermal ALD and radical-enhanced ALD.

In some embodiments, after the pore-sealing step, the thickness of the pore-sealing film is about 0.5 nm to about 10 nm, typically about 0.5 nm n to about 3 nm.

In some embodiments, the atmosphere of the pore-sealing step is hydrocarbon-free or oxygen-free. In some embodiments, the second gas (pore-sealing gas) is constituted by an aminosilane compound. In some embodiments, the second gas has no oxygen in its molecule. In some embodiments, the second gas is a gas constituted by at least one compound selected from the group consisting of bisdiethylaminosilane (BDEAS), bisdimethylaminosilane (BDMAS), hexylethy-laminosilane (HEAD), tetraethylaminosilane (TEAS), tert-butylaminosilane (TBAS), bistert-butylaminosilena (BT-BAS), bisdimethylaminodimethylaminosilane (BDMADMS), heptametyhlsilazane (HMDS), trimethylsilyldiethlamine (TMSDEA), trimethylsilyldimethlamine (TMSDMA), trimethyltoribinylcycletrisilazane (TMTVCTS), tristrimethylhydroxyamine (TTMSHA), bisdimethylsaminomethylsilane (BDMAMS), and dimetyhlsilyldimethlamine (DMSDMA).

In some embodiments, the reactive species are species generated from a reactant gas by a plasma or other energy. In some embodiments, the reactant gas may be selected from the group consisting of He, Ar, $NH_3$, $H_2$, and $N_2$. Preferably, the reactant gas is $N_2$, and the reactive species are consisted by a nitrogen plasma. The reactive species react with the adsorbed precursor to form a monolayer film. In steps (ii) and (iii), only the second gas is used as a precursor, or only the first gas and any inactive gas as a carrier gas. In some embodiments, the first gas and the second gas are the same gas or different gases. In some embodiments, the atmosphere of step (i) is oxygen-free.

In some embodiments, the pore-sealing step (steps (ii) and (iii)) comprises: placing a surface-restored dielectric film formed on a substrate in a reactor; supplying a second gas (pore-sealing gas) in a pulse to the reactor while supplying an inactive gas, thereby allowing the second gas to adsorb on the surface of the surface-restored dielectric film; purging the reactor to remove non-adsorbed second gas from the surface by continuously supplying the inactive gas; applying RF power in a pulse to the reactor to generate a plasma of the inactive gas, thereby causing surface reaction; purging the reactor to remove non-reacted products from the surface by continuously supplying the inactive gas; and repeating the above cycles. The purging can be accomplished by continuously supplying an inactive gas at a constant flow rate throughout steps (ii) and (iii), and after the pulse of the second gas supply, the reaction space is purged with the inactive gas. Alternatively, the purging can be accomplished by supplying an inactive gas immediately after the pulse of the second gas supply, or the purging can be accomplished simply by vacuuming the reactor.

In some embodiments, the pore-sealing film (the monolayer-accumulated film) is constituted by SiCN or SiCN:H so that the film exhibits excellent resistance to diffusion of a barrier metal or the like.

In some embodiments, in the pore-sealing step, the pore-sealing conditions shown in Table 3 are used. Since ALD is a self-limiting adsorption reaction process, the number of deposited precursor molecules is determined by the number of reactive surface sites and is independent of the precursor exposure after saturation, and a supply of the precursor is such that the reactive surface sites are saturated thereby per cycle.

TABLE 3

(the numbers are approximate)

| | Pore-sealing conditions |
|---|---|
| Second gas pulse (sec): Supply time of first gas | 0.5 to 5 sec (preferably 0.2 to 1.5 sec) |
| Substrate temperature (° C.) | 150 to 400° C. (preferably 200. to 300° C.) |
| Pressure (Torr) | 0.5 to 20 Torr (preferably 1. to 10 Torr) |
| Carrier gas | He, Ar |
| Flow rate of carrier gas (sccm) | 500. to 10,000 sccm (preferably 500 to 2,000 sccm) |
| Purge upon the second gas pulse | 0.2 to 5 sec (preferably 0.3 to 3 sec) |
| Purge gas (also as reactant gas) | $N_2$, He, Ar (preferably $N_2$) |

TABLE 3-continued (the numbers are approximate)

Pore-sealing conditions

| | |
|---|---|
| Flow rate of purge gas (sccm) | 500 to 10,000 sccm (preferably 500 to 2,000 sccm) |
| RF frequency (MHz) | 13.56 to 60 MHz |
| RF power (W) | 50 to 2,000 W (preferably 200 to 800 W for a 300-mm wafer) |
| RF power pulse (sec) | 0.2. to 10 sec (preferably 0.5 to 2 sec) |
| Reactant gas | $N_2$ |
| Flow rate of reactant gas (sccm) | 100 to 10,000 sccm (preferably 500 to 2,000 sccm) |
| Purge upon the RF power pulse | 0.5. to 5 sec (preferably 0.5 to 2 sec) |
| Duration of one cycle | 0.5. to 10 sec (preferably 1 to 3 sec) |
| Number of cycles repeated | 10 to 1,000 (preferably 20 to 400) |

In some embodiments, steps (i) to (iii) (the restoration step and the pore-sealing step) are conducted continuously in the same reactor. In this disclosure, "continuously" may refer to without breaking a vacuum, without interruption as a timeline, without changing treatment conditions, or immediately thereafter. Alternatively, steps (i) and (ii) can be conducted separately in different reactors, or discontinuously in the same reactor.

Figure 2:
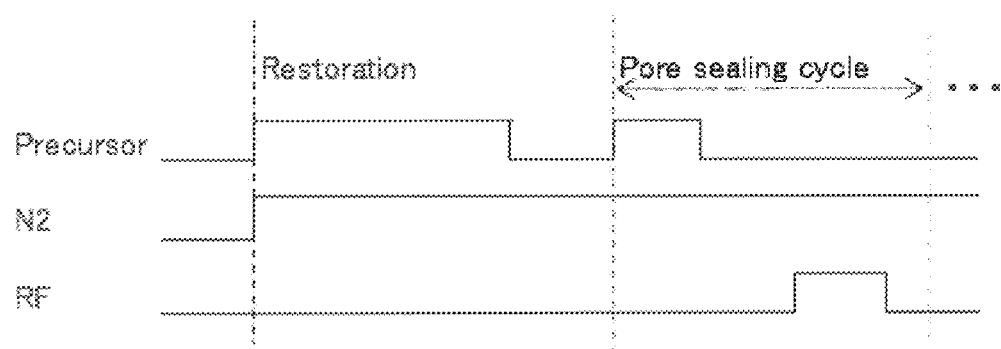
FIG. 2 illustrates a process sequence of a restoration step and a pore-sealing cycle according to an embodiment of the present invention.

FIG. 2 illustrates a process sequence of the restoration step and the pore-sealing cycle according to an embodiment of the present invention. In this embodiment, nitrogen gas is supplied continuously throughout the steps at a constant rate and also functions as a purge gas. In the restoration step, a precursor is supplied in a pulse, and in the pore-sealing cycle, the precursor is also supplied in a pulse, wherein the pulse of the precursor in the pore-sealing cycle is shorter than the pulse of the precursor in the restoration step. In the pore-sealing cycle, after the pulse of the precursor supply, RF power is applied in a pulse so as to generate a nitrogen plasma. In the restoration step, no RF power is applied. Between the pulse of the precursor supply in the restoration step and the pulse of the precursor supply in the pore-sealing cycle, between the pulse of the precursor supply and the pulse of RF power application in the pore-sealing cycle, and between the pulse of RF power application in the pore-sealing cycle and the pulse of the precursor supply in the next pore-sealing cycle, purging is conducted.

In embodiments, during the pore-sealing cycles (i.e., during step (iii)), the dielectric film is subject to damage caused by reactive species or radicals generated by a plasma. This is an irony since damage occurs during the repair process. In some embodiments, in step (iii), step (i') of adsorbing the first gas on the surface of the dielectric film by exposing the surface to the first gas to restore the surface with the first gas without depositing a film in the absence of reactive species is conducted between repetition of step (ii) in place of step (ii) intermittently in the sequence of repeating step (ii). Step (i') is substantially or nearly similar to step (i), the restoration step. However, operation variables in step (i') can be different from or the same as those in step (i), depending on, for example, the degree of damage exerted on the dielectric film during step (iii). Further, the operation variables of each step (i') can be different or the same. In some embodiments, in step (iii), step (i') and step (ii) are conducted continuously, and step (i') is conducted between repetition of step (ii) in place of step (ii) periodically in the sequence of repeating step (ii).

Figure 3:
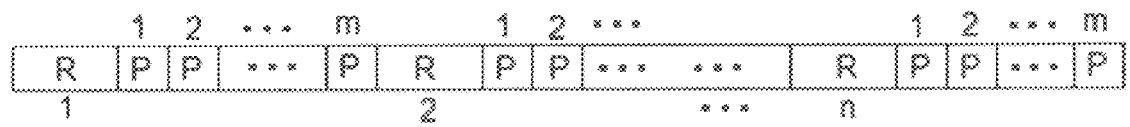
FIG. 3 illustrates a cyclic process sequence of a restoration step and a pore-sealing cycle according to an embodiment of the present invention.

FIG. 3 illustrates a cyclic process sequence of a restoration step and a pore-sealing cycle according to an embodiment of the present invention. In this figure, R represents the restoration step, and P represents the pore-sealing cycle. The pore-sealing cycle is repeated m*n times in total, wherein restoration step 1 is conducted, and the pore-sealing cycle is repeated m times, numbered 1 to m, and then, restoration step 2 is conducted, followed by repetition of the pore-sealing cycle numbered 1 to m. This sequence is repeated until the restoration step is conducted n times. By conducting the above sequence, the damaged dielectric film can be more effectively repaired, and the recovery rate of dielectric constant can be improved. In some embodiments, the increase in dielectric constant after the pore-sealing cycles (the fourth dielectric constant) as compared with the dielectric constant of the dielectric film upon the restoration step (the third dielectric constant) can be suppressed to about 50% or less (typically about 80% to about 20%) relative to the increase observed without the restoration step during the pore-sealing cycles.

In some embodiments, the duration of exposing the surface to the first gas in step (i') is longer than the duration of exposing the surface to the second gas in step (ii), but is shorter than or equal to the duration of exposing the surface to the first gas in step (i).

In some embodiments, in the restoration step during the pore-sealing cycles, the conditions shown in Table 4 are used. The other operation variables may be the same as in the restoration step before the pore-sealing cycles.

TABLE 4

(the numbers are approximate)

| | Restoration process during pore-sealing cycles |
|---|---|
| First gas pulse (sec): Supply time of first gas | 2 to 60 sec (preferably 4 to 30 sec) |
| Number of pore-sealing cycles conducted continuously (m) | 5 to 100 (preferably 10 to 50) |
| Number of restoration steps conducted before and during pore-sealing cycles (n) | 2 to 10 (preferably 2 to 5) |
| Total number of pore-sealing cycles conducted (m · n) | 10 to 1,000 (preferably 20 to 400) |

In some embodiments, a step of irradiating the substrate surface with UV light is conducted after the restoration process and/or the pore-sealing process. The conditions for irradiating the substrate with UV light disclosed in co-assigned U.S. patent application Ser. No. 13/450,368 can be used, the disclosure of which is incorporated herein by reference in its entirety. For example, after the restoration process but before the pore-sealing process, UV light irradiation is conducted at a temperature of about 250° C. under a pressure of about 10 Torr wherein hydrocarbon gas is supplied at about 90 sccm and nitrogen gas is supplied at about 500 sccm. This UV light irradiation can be conducted under the conditions for UV restoration disclosed in U.S Patent Publication No. 2011/0159202, the disclosure of which is incorporated by reference in its entirety. By conducting UV light irradiation between the restoration process and the pore-sealing process, the strength of a pore-sealing film can be increased while maintaining a low dielectric constant. This treatment is effective to increase resistance against diffusion of a barrier metal (see Example 7 described below).

In some embodiments, a step of hydrophobic treatment is conducted after the pore-sealing process, for further reducing the dielectric constant of the film. In hydrophobic treatment, OH groups are first generated on the pore-sealed surface of the film, and then, a self-assembled hydrophobic monolayer such as that used for the surface restoration is formed thereon by adsorbing gas molecules on the surface having OH groups. In some embodiments, the hydrophobic process comprises two steps in which the first step is for rendering the surface hydrophilic and the second step is for rendering the surface hydrophobic. For example, the hydrophilic process (the first step) can be conducted by introducing a gas for providing hydrophilic groups such as OH groups to the surface, and applying RF power under the following conditions.

TABLE 5

(the numbers are approximate)
Hydrophilization

| | |
|---|---|
| Usable gas for hydrophilization | $O_2$ |
| Flow rate (sccm) | 1 to 300 (preferably 1 to 20) |
| Additive gas | Ar |
| Flow rate (sccm) | 100 to 3000 (preferably 50 to 1500) |
| RF power (W) | 10 to 500 (preferably 30 to 50) |
| Duration of RF power (seconds) | 0.1 to 10 (preferably 0.5 to 3) |
| Temperature (° C.) | 25 to 400 (preferably 150 to 300) |
| Pressure (Pa) | 10 to 1000 (preferably 50 to 500) |
| Duration of hydrophilization process | 0.1 to 10 (preferably 0.5 to 3) |

The hydrophobic process (the second step) can be conducted in a manner similar to that for surface restoration, for example, by adsorbing a gas for rendering the surface hydrophobic onto the hydrophilic surface of the film (e.g., at a flow rate of the gas of about 1 sccm to about 2,000 sccm, typically about 1 sccm to about 100 sccm, at a temperature of about 25° C. to about 400° C., typically about 150° C. to about 300° C., at a pressure of about 10 Pa to about 1,000 Pa, typically about 50 Pa to about 500 Pa, for about 0.1 seconds to about 600 seconds, typically about 1 seconds to about 300 seconds). In some embodiments, the gas for rendering the surface hydrophobic may be an aminosilane gas (—N—Si—$(C_xH_y)_z$) having alkylsilane such as trimethylsilyldiethlamine (TMS-DEA), trimethylsilyldimethlamine (TMSDMA), etc.

Figure 5:
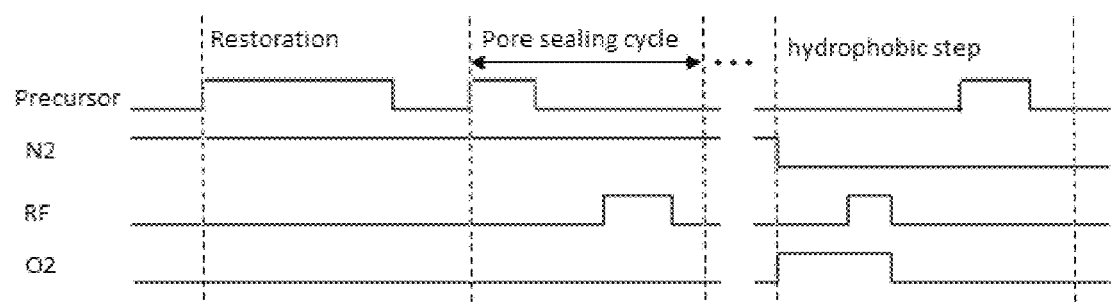
FIG. 5 illustrates a process sequence of a hydrophobic step according to an embodiment of the present invention.

FIG. 5 illustrates a process sequence of a hydrophobic step according to an embodiment of the present invention. After the pre-sealing cycle, the hydrophobic step begins under the conditions described above, for example, wherein the gas used for hydrophobic treatment is the same as that used for surface restoration.

In the above, the hydrophobic step consists of the hydrophilic process as the first step, and the hydrophobic process as the second step, and the hydrophilic process is conducted using oxygen gas and RF power. Alternatively, the hydrophilic process can be conducted by simply exposing the film to the environmental air at room temperature for about more than one second (typically about 30 seconds to about one day) after the pore-sealing process. Alternatively, the hydrophilic process can be conducted by exposing the pore-sealed surface of the film to $O_3$ (e.g., at a flow rate of $O_3$ of about one sccm to about 100 sccm, typically about 10 sccm to about 500 sccm, at a temperature of about 25° C. to about 400° C., typically about 150° C. to about 300° C., at a pressure or about 10 Pa to about 1,000 Pa, typically about 50 Pa to about 500 Pa, for about 3 seconds to about 600 seconds, typically about 5 seconds to about 120 seconds), or by irradiating the pore-sealed surface of the film with UV light (e.g., with an illumination of about 50 mW/cm$^2$ to about 300 mW/cm$^2$, typically about 70 mW/cm$^2$ to about 150 mW/cm$^2$, at a temperature of about 25° C. to about 400° C., typically about 150° C. to about 300° C., at a pressure or about 50 Pa to about 1,000 Pa, typically about 100 Pa to about 500 Pa, for about 1 seconds to about 600 seconds, typically about 10 seconds to about 300 seconds). Alternatively, the hydrophilic process can be conducted by adsorbing a hydrophilic gas having OH groups onto the pore-sealed surface of the film, such as tris(tert-pentoxy)silanol (TPOSL) or tetraethoxysilane (TEOS) (e.g., at a flow rate of about 1 sccm to about 500 sccm, typically about 1 sccm to about 200 sccm, at a temperature of about 50° C. to about 400° C., typically about 150° C. to about 300° C., at a pressure or about 10 Pa to about 1,000 Pa, typically about 50 Pa to about 500 Pa, for about 10 seconds to about 600 seconds, typically about 10 seconds to about 300 seconds).

Figure 8:
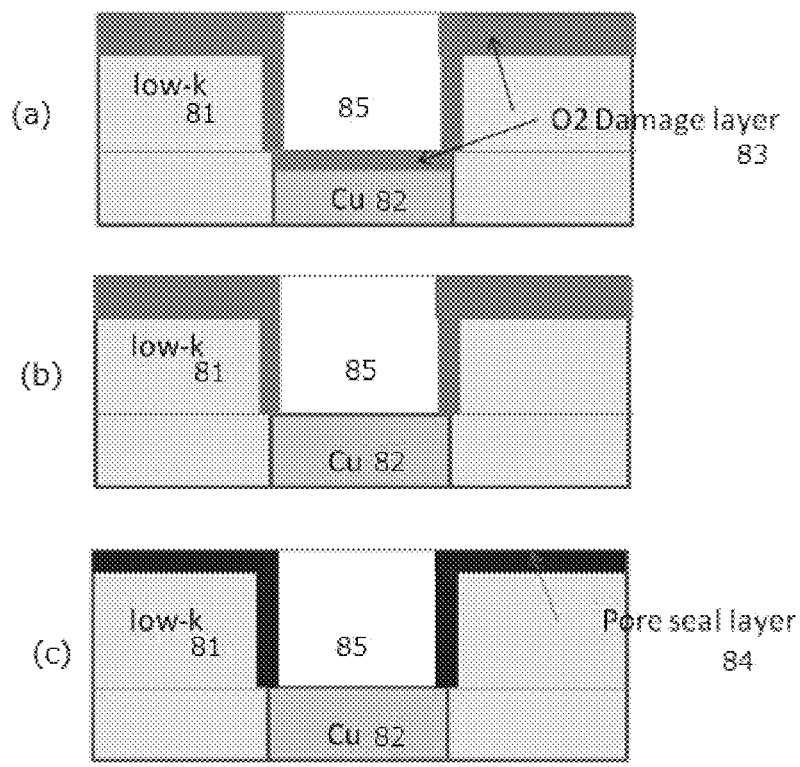
FIG. 8 illustrates processes of a selective deposition of a pore-seal layer according to an embodiment of the present invention.

In some embodiments, the accumulated monolayer films formed as a pore-sealing film or a pore-seal layer by the pore-sealing cycles can selectively be deposited regarding the location of the pore-seal layer by pre-treatment. For example, in some embodiments, since the pore-sealing cycles are conducted after a low-k film is etched, a copper wiring is exposed at a bottom of a trench, and a pore-seal layer needs to be deposited on the porous or damaged low-k film, not on the copper wiring. FIG. 8 illustrates processes of a selective deposition of a pore-seal layer according to an embodiment of the present invention, wherein a pore-seal layer is deposited selectively on a porous low-k film. The term "selective deposition" refers to selecting an area on which a film is deposited, which area is not the entire area but a part of the entire area.

Figure 6:
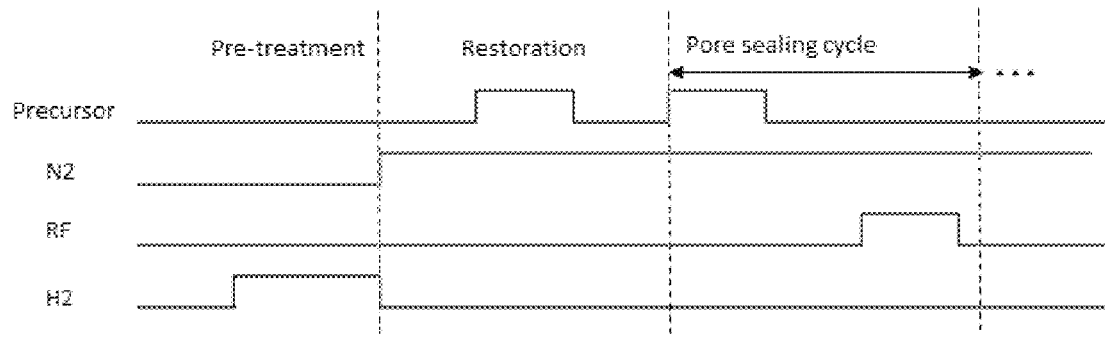
FIG. 6 illustrates a process sequence of a pre-treatment for selective deposition according to an embodiment of the present invention.

As illustrated in (a) of FIG. 8, after a trench 85 is formed by trench patterning using an oxygen plasma, the entire exposed surface 83 is oxidized, including a top surface of a low-k film 81 and sidewalls of the trench 85 constituted by the low-k film which are damaged due to the trench patterning, and also a bottom surface of the trench 85 constituted by a copper wiring 82 which is oxidized due to exposure to the air. The oxide layer of the copper wiring 82 can be removed much more easily than the damaged layer of the low-k film 81 by pre-treatment, e.g., reducing the oxide layer by heating the substrate at about 250° C. (typically about 250° C. to 400° C.) in a $H_2$ atmosphere at about 500 Pa (typically about 10 Pa to about 1,000 Pa) for about one minute (typically about 10 seconds to about 900 seconds). FIG. 6 illustrates a process sequence of the pre-treatment for selective deposition according to an embodiment of the present invention. Under the above conditions, the damaged layer of the low-k film is not sufficiently reduced for removal, and thus, as illustrated in (b) of FIG. 8, as a result, the damaged layer of the low-k film remains while the oxide layer of the copper wiring is removed and a copper surface is exposed. Since the degree of adsorption of a surface restoration gas such as an aminosilane is significantly different between a copper surface and an oxygen-damaged surface of a low-k film, the surface restoration gas adsorbs selectively on the damaged surface of the low-k film via OH groups present on the damaged surface, forming a self-assembled monolayer thereon, while being suppressed from adsorbing on the exposed surface of the copper wiring. After the surface restoration step, by conducting the pore-sealing step, as illustrated in (c) of FIG. 8, a pore-seal layer 84 can be deposited solely on the damaged surface of the low-k film, while being inhibited from being deposited on the surface of the copper wiring. Since a pore-seal layer is deposited selectively on the low-k film, but not on the copper wiring, a subsequent process for completing copper wiring can effectively and efficiently be conducted.

Figure 9:
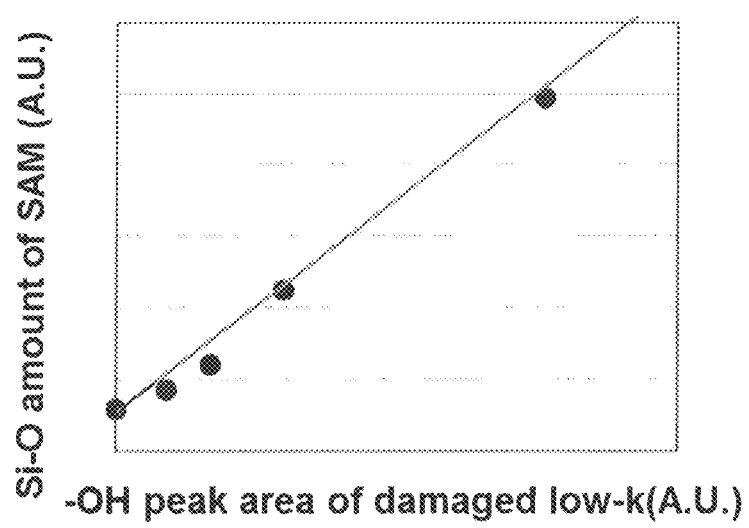
FIG. 9 is a graph showing the relationship between the peak area of —OH groups present on a damaged low-k surface (arbitrary unit) and the Si—O amount of a self-assembled monolayer formed on the damaged low-k surface (arbitrary unit) according to embodiments of the present invention.

In some embodiments, by increasing the quantity of OH groups present on a surface, a self-assembled monolayer can effectively be formed. That is, the damaged surface of a dielectric film is further damaged prior to the restoration step. This is particularly advantageous when the degree of damage made to a surface of a film is not high or the quantity of OH groups present on the surface is not high, so that a self-assembled monolayer may not securely be formed on the surface. FIG. 9 is a graph showing the relationship between the peak area of —OH groups present on a damaged low-k surface (arbitrary unit) and the Si—O amount of a self-assembled monolayer formed on the damaged low-k surface (arbitrary unit) according to embodiments of the present invention. As shown in FIG. 9, the amount of a self-assembled monolayer adsorbed onto a damaged surface is correlated with the quantity of —OH groups present on the damaged surface. Thus, in some embodiments, prior to the surface restoration step, the substrate is exposed to an $O_2$ plasma for a short period of time as a pre-oxidation treatment, thereby increasing OH groups on the surface, followed by the surface restoration step and the pore-sealing step, so that a self-assembled monolayer can be formed more securely and uniformly on the surface, and thus, pores can be sealed even when a thickness of a pore-seal layer is thin. The damage made during the pre-oxidation treatment can be recovered by the restoration step. In some embodiments, the pre-treatment can be conducted under the conditions shown in Table 6 below.

TABLE 6

(the numbers are approximate)
Pre-oxidation treatment for increasing OH groups

| | |
|---|---|
| Usable gas | $O_2$ |
| Flow rate (sccm) | 1 to 300 (preferably 1 to 20) |
| Additive gas | Ar |
| Flow rate (sccm) | 100 to 3000 (preferably 500 to 2000) |
| RF power (W) | 10 to 300 (preferably 20 to 60) |
| Duration of RF power (seconds) | 0.1 to 30 (preferably 0.5 to 5) |
| Temperature (° C.) | 25 to 400 (preferably 150 to 300) |
| Pressure (Pa) | 10 to 1000 (preferably 50 to 500) |
| Duration of the pre-treatment | 0.1 to 30 (preferably 0.5 to 5) |

Figure 7:
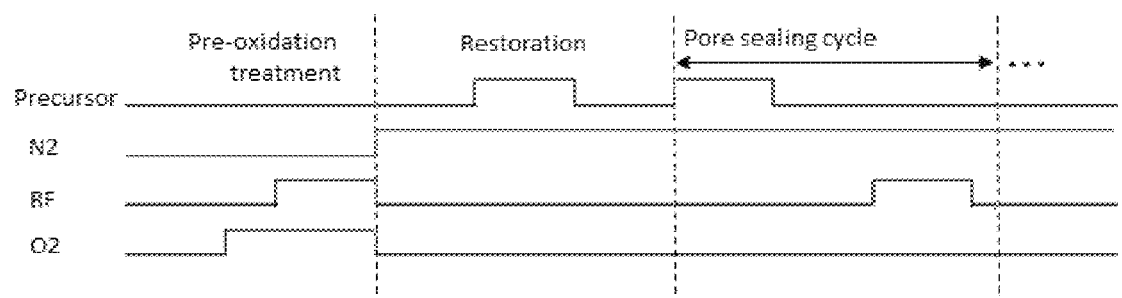
FIG. 7 illustrates a process sequence of a pre-oxidation treatment for increasing OH groups according to an embodiment of the present invention.

FIG. 7 illustrates a process sequence of the pre-oxidation treatment for increasing OH groups according to an embodiment of the present invention.

In the present disclosure where conditions and/or structures are not specified, the skilled artisan in the art can readily provide such conditions and/or structures, in view of the present disclosure, as a matter of routine experimentation. Also, in the present disclosure, the numerical values applied in specific embodiments can be modified by a range of at least ±50% in other embodiments, and the ranges applied in embodiments may include or exclude the endpoints.

EXAMPLES

FIG. 1 is a schematic view of a plasma ALD reactor with flow control valves, which can be used in some embodiments of the present invention. In this example, by providing a pair of electrically conductive flat-plate electrodes 4, 2 in parallel and facing each other in the interior 11 of a reaction chamber 3, applying HRF power (13.56 MHz or 27 MHz) 5 and LRF power of 5 MHz or less (400 kHz~500 kHz) 50 to one side, and electrically grounding 12 the other side, a plasma is excited between the electrodes. A temperature regulator is provided in a lower stage 2 (the lower electrode), and a temperature of a substrate 1 placed thereon is kept constant at a given temperature. The upper electrode 4 serves as a shower plate as well, and reaction gas and rare gas are introduced into the reaction chamber 3 through a gas flow controller 23, a pulse flow control valve 31, and the shower plate. Additionally, in the reaction chamber 3, an exhaust pipe 6 is provided, through which gas in the interior 11 of the reaction chamber 3 is exhausted. Additionally, the reaction chamber is provided with a seal gas flow controller 24 to introduce seal gas into the interior 11 of the reaction chamber 3 (a separation plate for separating a reaction zone and a transfer zone in the interior of the reaction chamber is omitted from this figure). Cyclic CVD can be performed using the same apparatus as above in some embodiments.

In the examples, the apparatus shown in the schematic diagram of FIG. 1 was used to form a film. Note that the present invention is not at all limited to the apparatus shown in this figure and any other apparatus can be used so long as it can perform PEALD.

Example 1

1) A Si substrate (300 mm in diameter) was placed in the reactor and a siloxane polymer film was formed on the substrate using Aurora® X (diethoxymethylsilane; ASM International N.V.) and Pore Builder™ (hydrocarbon for atom transfer radical polymerization; ASM International N.V.), He, and $O_2$. The substrate with the siloxane polymer film was transferred to a UV reactor and subjected to UV cure, thereby obtaining an ELK film having a dielectric constant of 2.00, a porosity of 40%, and a thickness of 200 nm.

2) Next, the substrate with the ELK film was transferred to a reactor for plasma ashing or etching under the conditions shown in Table 7 below, thereby causing plasma damage to the ELK film. As a result of the plasma damage, the dielectric constant of the ELK film increased to 2.42.

TABLE 7

| | Damage condition |
|---|---|
| RF frequency (MHz) | 13.56 MHz |
| HRF (W) | 60 W |
| Treatment time (sec) | 24 sec |
| Substrate temperature (° C.) | 250° C. |
| Pressure (Pa) | 466 Pa |
| He (sccm) | 2000 sccm |
| O2 (sccm) | 12 sccm |
| GAP (mm) | 8 mm |

3) Next, the substrate with the damaged ELK film was transferred to the reactor illustrated in FIG. 1 for restoration and pore-sealing using bisdiethylaminosilane (BDEAS) as the first gas under the conditions shown in Table 8 below, thereby obtaining a surface-restored ELK film. The surface-restored ELK film significantly recovered the dielectric constant to 2.15, i.e., the recovery rate [(2.42−2.15)/(2.42−2.00)] was calculated at 64%.

TABLE 8

| | Restoration process conditions |
|---|---|
| First gas pulse (sec): Supply time of first gas | 30 sec |
| Substrate temperature (° C.) | 250° C. |
| Pressure (Torr) | 4 Torr |
| Carrier gas | He |
| Flow rate of carrier gas (sccm) | 1,000 sccm |
| Purge gas | $N_2$ |
| Flow rate of purge gas (sccm) | 1,000 sccm |
| Purge upon the first gas pulse | 3 sec |

4) Another substrate with a surface-restored ELK film obtained in 3) was continuously processed in the reactor for pore-sealing using the same gas (BDEAS) as the second gas and the same inert gas ($N_2$) as the reactant gas under the conditions shown in Table 9 below, thereby obtaining a pore-sealed ELK film. The thickness of the pore-sealing film was 2 nm. The pore-sealed ELK film increased the dielectric constant to 2.24 which was, however, still lower than that of the damaged ELK film (2.42).

TABLE 9

| | Pore-sealing conditions |
|---|---|
| Second gas pulse (sec): Supply time of first gas | 1.5 sec |
| Substrate temperature (° C.) | 250° C. |
| Pressure (Torr) | 4 Torr |
| Carrier gas | He |
| Flow rate of carrier gas (sccm) | 1,000 sccm |
| Purge upon the second gas pulse | 2 sec |
| Purge gas (also as reactant gas) | $N_2$ |
| Flow rate of purge gas (sccm) | 1,000. Sccm |
| RF frequency (MHz) | 13.56 MHz |
| RF power (W) | 500 W |
| RF power pulse (sec) | 1.5 sec |
| Reactant gas | Same as purge gas |
| Flow rate of reactant gas (sccm) | Same as purge gas |
| Purge upon the RF power pulse | 0.5 sec |
| Duration of one cycle | 5.5 sec |
| Number of cycles repeated | 120 |

Example 2

In a manner substantially similar to that in Example 1, a damaged ELK film was prepared, which had a dielectric constant of 2.40. The damaged ELK was subjected to the restoration step and the pore-sealing cycles in the same manner as in Example 1 to obtain a pore-sealed ELK film. Next, the pore-sealed ELK film was loaded into the reactor and exposed to an oxygen plasma (an $O_2$ flow of 12 sccm, RF power of 60 W, a duration of 24 sec, a pressure of 5 Torr, a temperature of 250° C.). The dielectric constant of the plasma-exposed ELK film was 2.40, which was unchanged from that before the oxygen plasma exposure, indicating that the pore-sealing significantly improved resistance to an oxygen plasma, which is indicative of resistance to diffusion of a metal.

Comparative Example

In a manner substantially similar to that in Example 2, a damaged ELK film was prepared, which had a dielectric constant of 2.30. Without conducting the restoration step and the pore-sealing cycles, the damaged ELK film was loaded into the reactor and exposed to an oxygen plasma in the same manner as in Example 2. The dielectric constant of the plasma-exposed ELK film significantly increased to 3.2, which was a 39% increase ($\Delta k=+0.9$) from that before the oxygen plasma exposure, indicating that the porous film was susceptible to plasma damage and is likely to lack resistance to diffusion of a metal.

Examples 3 and 4

Figure 4:
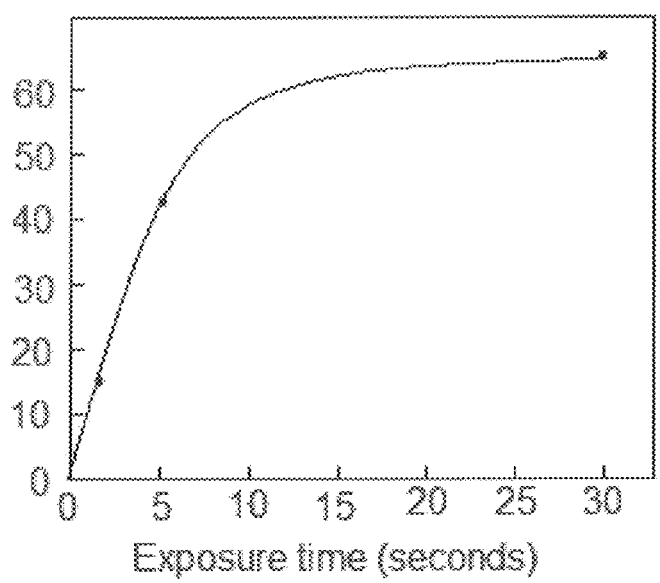
FIG. 4 is a graph illustrating the relationship between the dielectric constant and the gas exposure time (sec) in the restoration step according to an embodiment of the present invention.

In a manner substantially similar to that in Example 1, an ELK film was prepared and then subjected to plasma damage to obtain a damaged ELK film. The damaged ELK was subjected to the restoration step in the same manner as in Example 1 except for the duration of gas exposure to obtain a surface-restored ELK film. The duration of gas exposure was 1.5 seconds (Example 3) and 5 seconds (Example 4) as compared with 30 seconds (Example 1). The dielectric constant of each film is shown in Table 10 below. As shown in Table 10, when the duration of gas exposure was 5 seconds, the dielectric constant decreased from 2.45 to 2.26, i.e., the recovery rate [(2.45−2.26)/(2.45−2.00)] was 42% (Example 3), and when the duration of gas exposure was 1.5 seconds, the dielectric constant decreased from 2.43 to 2.36, i.e., the recovery rate [(2.43−2.36)/(2.43−2.00)] was 16% (Example 4). In Example 1, when the duration of gas exposure was 30 seconds, the dielectric constant decreased from 2.42 to 2.15, i.e., the recovery rate [(2.42−2.15)/(2.42−2.00)] was 64%. The results are shown in FIG. 4. As illustrated in FIG. 4, by prolonging the exposure time beyond about 5 seconds, the restoration can drastically progress.

TABLE 10

| Exposure time (sec) | ELK | after damage | after exposure | Recovery |
|---|---|---|---|---|
| 1.5 | 2.00 | 2.43 | 2.36 | 16% |
| 5 | 2.00 | 2.45 | 2.26 | 42% |
| 30 | 2.00 | 2.42 | 2.15 | 64% |

Example 5

In a manner substantially similar to that in Example 1, an ELK film was prepared and then subjected to plasma damage to obtain a damaged ELK film. The damaged ELK was subjected to the restoration step in the same manner as in Example 1 except that the duration of gas exposure to obtain a surface-restored ELK film was 3 seconds, and the restoration gas (first gas) was trimethylsilyldimethlamine (TMDMAS). The surface-restored ELK was subjected to the pore-sealing step in the same manner as in Example 1 except that the duration of gas supply was 0.2 seconds, and the pore-sealing gas (second gas) was TMDMAS. The dielectric constant of each film was as follows: 2.00 for the initial ELK film, 2.42 for the damaged ELK film, 2.20 for the surface-restored ELK film, and 2.28 for the pore-sealed ELK film.

The pore-sealed ELK film was then continuously subjected to the following hydrophobic treatment. After the pore-sealing step, to the same reactor wherein the substrate was maintained, 100 sccm of $O_2$ were supplied with 500 sccm of Ar, and 30 W of RF power were applied for one second under a pressure of 200 Pa, thereby first rendering the surface hydrophilic by generating OH groups on the pore-sealed surface. Thereafter, TMDMAS was supplied for three seconds to the reactor so as to adsorb TMDMAS on the surface with the OH groups, thereby forming a self-assembled monolayer of TMDMAS and rendering the surface hydrophobic. The sequence of the above processes is illustrated in FIG. 5. The dielectric constant of the film with the hydrophobic surface was 2.20 as shown in Table 11.

TABLE 11

| ELK | After damage | After surface restoration | After pore-sealing | After hydrophobic treatment |
|---|---|---|---|---|
| 2.00 | 2.42 | 2.20 | 2.28 | 2.20 |

Example 6

In a manner substantially similar to that in Example 1, an ELK film was prepared and then subjected to plasma damage to obtain a damaged ELK film. The damaged ELK was subjected to a pre-oxidation treatment under the conditions shown in Table 12.

TABLE 12

| Pre-oxidation treatment for increasing OH groups | |
| --- | --- |
| Used gas | O$_2$ |
| Flow rate (sccm) | 15 |
| Additive gas | Ar and He |
| Flow rate (sccm) | 1 slm and 0.5 slm, respectively |
| RF power (W) | 50 |
| Duration of RF power (seconds) | 5 |
| Temperature (° C.) | 250 . . . |
| Pressure (Pa) | 200 |
| Duration of the pre-treatment | 5 . . . |

The pre-oxidized ELK film was then subjected to the restoration step in the same manner as in Example 1. The surface-restored ELK was subjected to the pore-sealing step in the same manner as in Example 1 except that the thickness of the pore-sealing film was a half of that of the one formed in Example 1. However, the dielectric constant of the pore-sealed ELK film was as low as that in Example 1.

Example 7

In a manner substantially similar to that in Example 1, an ELK film was prepared and then subjected to plasma damage to obtain a damaged ELK film. The damaged ELK film was subjected to the restoration process described in 3) in Example 1, and then the pore-sealing process described in 4) in Example 1 except that the number of cycles repeated in the pore-sealing process was 40 (a thickness of the pore-sealing film was 0.8 nm). Next, a barrier metal (TiN) layer was deposited on the pore-sealing film by thermal ALD with TiCl4 at deposition temperature 400 C. Thereafter, the ELK film was subjected to analysis (by backside SIMS) to see whether diffusion of the barrier metal in the ELK film was detected, and as a result, it was confirmed that diffusion of the barrier metal was detected, indicating that the thickness of the pore-sealing film (here 0.8 nm, 40 cycles) may not be sufficient for fully blocking diffusion of the barrier metal.

Next, another ELK film was prepared and processed in the same manner as above, except that a UV light irradiation was conducted between the restoration process and the pore-sealing process at a temperature of 250° C. under a pressure of 10 Torr for 120 seconds while a hydrocarbon gas (butadiene) was supplied at 90 sccm and nitrogen gas was supplied at 50 sccm. The ELK film was subjected to analysis to see whether diffusion of the barrier metal in the ELK film was detected, and as a result, it was confirmed that no diffusion of the barrier metal was detected, indicating that even when the thickness of the pore-sealing film was not sufficient, by conducting UV light irradiation between the restoration process and the pore-sealing process, diffusion of the barrier metal can fully be blocked.

The present invention includes the above-disclosed embodiments and other embodiments including the following:

1) A method and equipment for a restoration process and a pore-sealing process for a porous low-k material without being exposed to air, comprising:
   I) exposing a porous low-k film to a restoration gas; and
   II) depositing a pore-sealing film, comprising:
      i) introducing a precursor gas into a reaction space where the porous low-k film on a substrate is placed;
      ii) generating a plasma in the reaction space using N2;
      iii) treating the adsorbed precursor with the plasma to form a film, wherein step (i) to (ii) constitute one cycle; and
      iv) repeating the one cycle multiple times.

2) A method and equipment according to any of the foregoing, wherein no precursor gas is supplied in steps ii) and iii).

3) A method and equipment according to any of the foregoing, wherein a purge process is conducted between steps (i) and (ii).

4) A method and equipment according to any of the foregoing, wherein the pore-sealing film is a SiCN film.

5) A method and equipment according to any of the foregoing, wherein the restoration gas is capable of forming a self-assembled monolayer on a surface with OH groups.

6) A method and equipment according to any of the foregoing, wherein the restoration gas is constituted by an aminosilane compound, alkoxysilane compound, or silazane compound.

7) A method and equipment according to 6), wherein the restoration gas has one or two Si—N bonds.

8) A method and equipment according to any of the foregoing, wherein the pore-sealing film is a SiCN:H film.

9) A method and equipment according to any of the foregoing, wherein the thickness of the pore-sealing film is in a range of 0.5 nm to 10 nm.

10) A method and equipment according to any of the foregoing, wherein the precursor gas is constituted by an aminosilane compound.

11) A method and equipment according to 10), wherein the precursor gas is constituted by an aminosilane compound containing no oxygen.

12) A method and equipment according to any of the foregoing, wherein the precursor gas is constituted by at least one compound selected from the group consisting of bisdiethylaminosilane (BDEAS), bisdimethylaminosilane (BDMAS), hexylethylaminosilane (HEAD), tetraethylaminosilane (TEAS), tert-butylaminosilane (TBAS), bistert-butylaminosilena (BTBAS), bisdimethylaminodimethylaminosilane (BDMADMS), trimethylsilyldiethlamine (TMSDEA), trimethylsilyldimethlamine (TMSDMA), bisdimethylsaminomethylsilane (BDMAMS), and dimetyhlsilyldimethlamine (DMSDMA).

13) A method and equipment according to any of the foregoing, wherein the restoration gas is constituted by at least one compound selected from the group consisting of bisdiethylaminosilane (BDEAS), bisdimethylaminosilane (BDMAS), hexylethylaminosilane (HEAD), tetraethylaminosilane (TEAS), tert-butylaminosilane (TBAS), bistert-butylaminosilena (BTBAS), bisdimethylaminodimethylaminosilane (BDMADMS), heptametyhlsilazane (HMDS), trimethylsilyldiethlamine (TMSDEA), trimethylsilyldimethlamine (TMSDMA), trimethyltoribinylcycletrisilazane (TMTVCTS), tristrimethylhydroxyamine (TTMSHA), bisdimethylsaminomethylsilane (BDMAMS), and dimetyhlsilyldimethlamine (DMSDMA).

14) A method and equipment according to any of the foregoing, wherein the recovery ratio of dielectric constant of the porous low-k film is more than 40% after the restoration process but before the pore-sealing process.

15) A method and equipment according to any of the foregoing, wherein the substrate is kept at a temperature of 400° C. or less.

16) A method and equipment according to any of the foregoing, wherein the pore-sealing process is conducted at a temperature of 150° C. or higher, preferably 200° C. or higher.

17) A method and equipment according to any of the foregoing, wherein a step of irradiating the substrate surface with UV light is conducted after the restoration process and/or the pore-sealing process.

18) A method and equipment according to any of the foregoing, wherein the restoration process and the pore-sealing process are conducted continuously without breaking a vacuum.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for repairing process-related damage of a dielectric film formed on a substrate caused by processing the dielectric film, wherein the dielectric film has a first dielectric constant before the processing, and the damaged dielectric film has a second dielectric constant which is higher than the first dielectric constant, comprising:
   (i) adsorbing a first gas containing silicon on a surface of the damaged dielectric film by exposing the surface to the first gas to restore the surface with the first gas without depositing a film in the absence of reactive species, wherein the surface-restored dielectric film has a third dielectric constant which is lower than the second dielectric constant;
   (ii) adsorbing a second gas containing silicon on a surface of the surface-restored dielectric film by exposing the surface to the second gas, followed by applying reactive species to the second gas-adsorbed surface of the dielectric film, to form a monolayer film thereon, wherein the duration of exposing the surface to the first gas in step (i) is longer than the duration of exposing the surface to the second gas in step (ii); and
   (iii) repeating step (ii) to accumulate monolayer films to cover the surface of the surface-restored dielectric film.

2. The method according to claim 1, wherein the thickness of the accumulated monolayer films obtained in step (iii) is about 0.5 nm to about 10 nm.

3. The method according to claim 1, wherein step (i) continues to provide a dielectric constant recovery rate, R, of the surface-restored dielectric film of at least 40%, wherein $R=(\in2-\in3)/(\in2-\in1)\times100$ where $\in1$ is the first dielectric constant, $\in2$ is the second dielectric constant, and $\in3$ is the third dielectric constant.

4. The method according to claim 1, wherein in step (iii), step (i') of adsorbing the first gas on the surface of the dielectric film by exposing the surface to the first gas to restore the surface with the first gas without depositing a film in the absence of reactive species is conducted between repetition of step (ii) in place of step (ii) intermittently in the sequence of repeating step (ii).

5. The method according to claim 4, wherein in step (iii), step (i') and step (ii) are conducted continuously, and step (i') is conducted between repetition of step (ii) in place of step (ii) periodically in the sequence of repeating step (ii).

6. The method according to claim 1, wherein steps (i) to (iii) are conducted continuously.

7. The method according to claim 1, wherein the first gas and the second gas are the same gas.

8. The method according to claim 1, wherein the first gas and the second gas are different gases.

9. The method according to claim 1, wherein the accumulated monolayer films are constituted by SiCN or SiCN:H.

10. The method according to claim 1, wherein the first gas is a gas capable of replacing OH groups and self-assembling on the surface of the damaged dielectric film.

11. The method according to claim 10, wherein the first gas has one or two Si—N bonds in its molecule.

12. The method according to claim 10, wherein the first gas is a gas constituted by at least one compound selected from the group consisting of aminosilane compounds, alkoxysilane compounds, and silazane compounds.

13. The method according to claim 1, wherein the second gas is constituted by an aminosilane compound.

14. The method according to claim 13, wherein the second gas has no oxygen in its molecule.

15. The method according to claim 13, wherein the second gas is a gas constituted by at least one compound selected from the group consisting of bisdiethylaminosilane (BDEAS), bisdimethylaminosilane (BDMAS), hexylethylaminosilane (HEAD), tetraethylaminosilane (TEAS), tert-butylaminosilane (TBAS), bistert-butylaminosilena (BT-BAS), bisdimethylaminodimethylaminosilane (BDMADMS), heptametyhlsilazane (HMDS), trimethylsilyldiethlamine (TMSDEA), trimethylsilyldimethlamine (TMSDMA), trimethyltoribinylcycletrisilazane (TMTVCTS), tristrimethylhydroxyamine (TTMSHA), trimethylsilyldiethylamine (TMSDEA), bisdimethylsaminomethylsilane (BDMAMS), and dimetyhlsilyldimethlamine (DMSDMA).

16. The method according to claim 1, wherein the reactive species used in step (ii) is a nitrogen plasma.

17. The method according to claim 1, wherein step (i) comprises supplying the first gas to a reaction space where the substrate is placed and purging the reaction space, and step (ii) comprises supplying the second gas to the reaction space, purging the reaction space, applying the reactive species to the reaction space, and then purging the reaction space.

18. The method according to claim 1, wherein the first dielectric constant is less than 2.5.

19. The method according to claim 1, wherein steps (i) to (iii) are conducted at a temperature of about 150° C. to about 400° C.

20. The method according to claim 1, wherein the substrate has a recess having faces exposing the surface of the damaged dielectric film and a surface of a copper layer.

21. The method according to claim 20, further comprising decreasing film growth selectively on the surface of the copper layer relative to the surface of the damaged dielectric film, prior to step (i).

22. The method according to claim 21, wherein the decreasing of film growth selectively on the surface of the copper layer is conducted by reducing the surface of the copper layer.

23. The method according to claim 22, wherein the reduction of the surface of the copper layer is conducted by treating the surface of the damaged dielectric film and the surface of the copper layer with hydrogen, whereby the surface of the copper layer is selectively reduced.

24. The method according to claim 1, further comprising oxidizing the surface of the damaged dielectric film to further damage the surface of the damaged dielectric film prior to step (i).

25. The method according to claim 1, further comprising subjecting a surface of the accumulated monolayer films to hydrophobic treatment after step (iii).

26. The method according to claim 1, further comprising irradiating the surface of the damaged dielectric film obtained with UV light between steps (i) and (ii).

* * * * *